(12) United States Patent
Sattler et al.

(10) Patent No.: US 11,788,704 B2
(45) Date of Patent: Oct. 17, 2023

(54) MOTOR VEHICLE HEADLAMP

(71) Applicant: ZKW Group GmbH, Wieselburg (AT)

(72) Inventors: Jochen Sattler, St. Georgen am Ybbsfeld (AT); Thomas Haas, Mank (AT); Lukas Dienstbier, Wieselburg an der Erlauf (AT)

(73) Assignee: ZKW Group GmbH, Wieselburg (AT)

( * ) Notice: Subject to any disclaimer, the term of this patent is extended or adjusted under 35 U.S.C. 154(b) by 64 days.

(21) Appl. No.: 17/640,459

(22) PCT Filed: Sep. 3, 2020

(86) PCT No.: PCT/EP2020/074630
§ 371 (c)(1),
(2) Date: Mar. 4, 2022

(87) PCT Pub. No.: WO2021/043917
PCT Pub. Date: Mar. 11, 2021

(65) Prior Publication Data
US 2022/0325865 A1 Oct. 13, 2022

(30) Foreign Application Priority Data

Sep. 4, 2019 (EP) ..................................... 19195422

(51) Int. Cl.
*F21S 41/50* (2018.01)
*B60Q 1/04* (2006.01)
(Continued)

(52) U.S. Cl.
CPC ................ *F21S 41/50* (2018.01); *B60Q 1/04* (2013.01); *C03C 17/3605* (2013.01);
(Continued)

(58) Field of Classification Search
CPC .. F21S 41/50; C03C 17/3605; C03C 17/3657; C03C 17/3684; C03C 14/0015;
(Continued)

(56) References Cited

U.S. PATENT DOCUMENTS 6,356,376 B1 * 3/2002 Tonar ...................... G02F 1/155
359/275
11,060,691 B2 * 7/2021 Allen ...................... F21S 43/14
(Continued)

FOREIGN PATENT DOCUMENTS

DE  10062592 A1  9/2002
DE  10230277 A1  1/2004
(Continued)

OTHER PUBLICATIONS

International Search Report for PCT/EP2020/074630, dated Nov. 2, 2020 (18 pages).
(Continued)

*Primary Examiner* — Bryon T Gyllstrom
(74) *Attorney, Agent, or Firm* — Eversheds Sutherland (US) LLP (57) ABSTRACT

The invention relates to a motor vehicle headlamp (8) comprising
  a vehicle headlamp housing (9),
  an at least sectionally transparent cover pane (10) that closes the vehicle headlamp housing (9),
  a light source (11) that is accommodated in the vehicle headlamp housing (9) and serves for radiating light through the cover pane (10), and
  at least one motor vehicle design element (3) that is accommodated in the vehicle headlamp housing (9), wherein the at least one motor vehicle design element (3) comprises a dimensionally stable substrate (1) with at least one coated side.

19 Claims, 3 Drawing Sheets

(51) Int. Cl.
*C03C 17/36* (2006.01)
*C23C 14/00* (2006.01)
*C23C 14/08* (2006.01)
*C23C 14/18* (2006.01)
*C23C 14/20* (2006.01)
*C23C 14/34* (2006.01)

(52) U.S. Cl.
CPC ...... *C03C 17/3657* (2013.01); *C03C 17/3684* (2013.01); *C23C 14/0015* (2013.01); *C23C 14/0036* (2013.01); *C23C 14/083* (2013.01); *C23C 14/185* (2013.01); *C23C 14/205* (2013.01); *C23C 14/34* (2013.01); *C03C 2218/155* (2013.01)

(58) Field of Classification Search
CPC . C03C 14/0036; C03C 14/083; C03C 14/185; C03C 14/205; C03C 14/34
See application file for complete search history.

(56) References Cited

U.S. PATENT DOCUMENTS

| | | | |
|---|---|---|---|
| 2001/0055212 A1 | 12/2001 | Phillips | |
| 2005/0195488 A1* | 9/2005 | McCabe | G02B 5/085 359/603 |
| 2008/0310005 A1* | 12/2008 | Tonar | B60R 1/085 359/265 |
| 2011/0310610 A1* | 12/2011 | Brown | F21S 41/24 362/253 |
| 2012/0148872 A1* | 6/2012 | Chang | C23C 14/0015 428/650 |
| 2015/0212244 A1* | 7/2015 | Kim | C23C 28/34 204/192.28 |
| 2018/0328564 A1 | 11/2018 | Albou et al. | |
| 2019/0112698 A1* | 4/2019 | Hu | C23C 14/3442 |
| 2019/0243040 A1 | 8/2019 | Parker | |

FOREIGN PATENT DOCUMENTS

| | | |
|---|---|---|
| EP | 3498879 A1 | 6/2019 |
| JP | H10294004 A | 11/1998 |
| JP | 2002274101 A | 9/2002 |

OTHER PUBLICATIONS

Search Report for European Patent Application No. 19195422.1 dated Jun. 25, 2020 (28 pages).

Skowronski L et al, "Characterization of optical and microstructural properties of semitransparent TiO2/Ti/glass interference decorative coatings", Applied Surface Science, Elsevier, Amsterdam, NL, Band 388, Jun. 1, 2016 (Jun. 1, 2016), pp. 731-740.

L. Skowronski et al, "Optical and microstructural properties of decorative Al/Ti/TiO2 interference coatings", Applied Surface Science, Band 421, Nov. 1, 2017 (Nov. 1, 2017), pp. 794-801.

* cited by examiner

MOTOR VEHICLE HEADLAMP

The invention relates to a motor vehicle headlamp comprising
- a vehicle headlamp housing,
- an at least sectionally transparent cover pane that closes the vehicle headlamp housing,
- a light source that is accommodated in the vehicle headlamp housing and serves for radiating light through the cover pane, and
- at least one motor vehicle design element that is accommodated in the vehicle headlamp housing, wherein the at least one motor vehicle design element comprises a dimensionally stable substrate with at least one coated side.

The coated side allows a chromatic depiction of contents. Reflections on the transparent cover pane basically make it more difficult to clearly depict chromatic design characteristics or logos in a vehicle headlamp outward. The permanent application of anti-reflection coatings on the outer side of a cover pane is technically difficult due to the required long service life and the massively pronounced environmental influences, to which a headlamp is subjected. An objective of the invention therefore can be seen in developing an option for depicting selected contents arranged in the vehicle headlamp outward as clearly as possible.

According to the invention, this objective is attained with a motor vehicle headlamp of the initially described type in that the coated side of the substrate has at least two sections that differ with respect to their surface design, namely a first section that has a rough surface and a second section that has a smooth surface, wherein the coating of the coated side of the substrate is formed by at least a first chromophoric and metallically reflective layer and a second chromophoric layer covering the first layer is provided, wherein the second layer is at least partially transparent and designed in such a way that the light incident on the at least one motor vehicle design element is at least partially manipulated due to interference in that the light beams reflected by the surface of the first layer are superimposed with the light beams reflected by the surface of the second layer, wherein the respective layers are applied in such a way that the surface designs of the respective sections of the substrate are transferred to the layers such that light incident on the respective layer in the region of the first section is scattered in accordance with the surface design of the first section of the substrate and light incident on the respective layer in the region of the second section is reflected in accordance with the surface design of the second section of the substrate. These characteristics make it possible to design contents or optically relevant surfaces in a chromatically homogenous yet high-contrast manner despite reflections on the cover pane.

The following portion of the description concerns surface properties of screen elements, which are manufactured, e.g., in injection molding processes or in which the substrate used for the screen element is manufactured in an injection molding process, wherein the substrate may consist, e.g., of a plastic. The surface of each substrate has a minimal amount of unevenness due to irregularities in the surface, e.g., of the injection molding tool or due to other influences. This creates so-called graining (which is also described, e.g., in VDI Standard 3400), i.e. unevenness in the surface that can also be produced intentionally in order to implement surface structures in accordance with design specifications. Negative shapes of this graining can be intentionally produced in the injection molding tool used for the manufacture of the screen element with corresponding methods such as laser treatment/etching/stamping and are correspondingly transferred to the surface of the cast substrate of the screen element. Alternatively, smooth substrates of screen elements can be directly provided with such a graining in a subsequent treatment process, in which the aforementioned methods, i.e. laser treatment/etching/stamping, can likewise be applied.

The extent of this unevenness can be measured by means of a technical variable, namely the so-called average roughness value Ra. The average roughness value Ra indicates the average distance of a measuring point—on the surface—from the center line. The center line intersects the actual profile within the reference distance in such a way that the sum of the profile deviations is distributed over the length of the measuring distance in a plane extending parallel to the center line. The term "average roughness value" is a generally recognized technical term that is regularly used in the relevant literature and therefore familiar to a person skilled in the art.

In the context of the present invention, the term "smooth" refers to a surface that has an average roughness value of no more than 0.25 µm, i.e. $Ra \leq 0.25$.

The term "rough" refers to a surface that has an average roughness value of at least 2.0 µm, i.e. $Ra \geq 2.0$ µm. A maximum roughness value, which is still technically advantageous for the present purposes, may likewise be defined. For example, the maximum roughness may amount to 25 µm, i.e. $Ra \leq 25$ µm.

The first and/or second layer particularly may have a constant composition and layer thickness along the entire side of the substrate to be coated. In other words, a uniform and homogenous color impression can thereby be achieved along the entire coating.

The first layer furthermore may be designed in such a way that an opaque layer with a layer thickness of at least 20 nm is formed by the first layer. The term "opaque" means that the transmittance is lower than or equal to 0.001, i.e. no higher than one per mil or 0.1%. In the context of the present invention, the transmittance of "opaque" objects particularly may amount to 0.01%, 0.001% or even exactly 0%. The opaque cover layer may also be designed in a light-absorbing manner.

The first section particularly may be enclosed by the second section and designed in such a way that a graphic symbol is depicted due to the rough surface design of the first section, wherein said graphic symbol is visible in the form of an optical contrast to the surrounding reflective area of the second section. In this way, graphic symbols can be depicted in a particularly impressive and clearly recognizable manner despite reflections on the cover pane.

At least one motor vehicle design element furthermore may have a radiation area that is at least partially arranged in the beam path of the light source, wherein the first section completely extends over the radiation area and therefore completely covers this radiation area such that light originating from the light source, which is facultatively influenced by optical, refractive and/or reflective elements and incident into the radiation area, is scattered in the radiation area. This makes it possible to prevent dazzle caused by light that originates from the light source and is reflected by the motor vehicle design element. It would be possible, in particular, that the radiation area is completely arranged in the beam path of the light source.

The coated side of the substrate of the at least one motor vehicle design element furthermore may have an ambient light reflection area that is located outside the beam path of the light source, wherein the second section extends at least partially, particularly completely, over the ambient light reflection area. In this way, the smooth area can be completely exposed to ambient light. This is unproblematic because ambient light typically is not associated with any risk of dazzle. It would be possible, in particular, that the ambient light reflection area covers the entire visible area of the at least one motor vehicle design element, which lies outside of the beam path of the light source, in the installed state.

The rough surface of the second section furthermore may have an average roughness value Ra of at least 2.0 µm.

The smooth surface of the second section particularly may have an average roughness value Ra of no more than 0.25 µm.

The second layer furthermore may have a transmittance of at least 70%. The term "transmittance" (to which the Greek symbol "τ" is typically assigned in technical literature) refers to the inverse ratio of the radiant power incident on a medium (i.e. of the light incident on the light entry surface of the medium) to the radiant power allowed to pass through. During the measuring process, the light is incident on the light entry surface of the medium at a right angle in the form of a bundle of parallel beams. The term "reflectance" (to which the Greek symbol "ρ" is typically assigned in technical literature) refers to the inverse ratio of the radiant power incident on a medium to the reflected radiant power. Presently, it is therefore assumed that light is incident on the respective surface normally, wherein the indicated values apply at least to a wavelength range between 400 nm and 800 nm.

A protective layer particularly may be applied on the second layer by means of plasma polymerization, wherein this protective layer particularly is a layer consisting of hexamethyldisiloxane. In this case, the protective layer preferably can be designed in such a way that the light between 400 nm and 800 nm, which is reflected by the motor vehicle design element, is not manipulated with respect to its color composition due to interference in at least one spectral component of the light.

A base layer furthermore may be arranged between the substrate and the first layer. The base layer BL may consist of the same material as that used for the above-described protective layer, i.e. of a layer that is applied, for example, by means of plasma polymerization, wherein this protective layer particularly may be a layer consisting of hexamethyldisiloxane.

The metallic and at least partially reflective first layer particularly may have a layer thickness that lies between a minimum layer thickness and a maximum layer thickness, wherein the minimum layer thickness is the thickness required for ensuring a transmittance of less than 1% and the maximum layer thickness is no greater than the quadruple minimum layer thickness, preferably no greater than triple or double the minimum layer thickness.

The second layer furthermore may be largely free of non-luminous colors, wherein a non-luminous color is a color that becomes discernible due to at least partial absorption of spectrums of the visible light, wherein the extent of the absorption of the color components red, green and blue is dissimilar, and wherein the second layer is designed in such a way that the light reflected by the motor vehicle design element is manipulated with respect to its color composition due to interference in at least one spectral component of the light. In this context, the expression "largely free" means that the color effect is primarily created due to interference and not due to absorption of spectral portions in the material, i.e. the absorptance for visible light within the frequency spectrum (400 nm to 800 nm wavelength) of visible light fluctuates, for example, by less than 30%.

The invention furthermore may relate to a motor vehicle comprising a motor vehicle headlamp according to one of the preceding claims.

The invention furthermore may relate to a method for manufacturing an opaque motor vehicle design element.

The invention furthermore may relate to a motor vehicle design element manufactured in accordance with the inventive method, to a vehicle headlamp comprising an inventive opaque motor vehicle design element and to a motor vehicle comprising an inventive opaque motor vehicle design element.

Motor vehicle design elements, which particularly should be designed in a colored manner or should have matte or shiny surfaces, are typically manufactured in the form of a plastic component, wherein the final appearance of the surfaces is typically defined in a painting process with corresponding paints. Colored, shiny or matte vehicle headlamp design elements can thereby be manufactured.

A disadvantage of conventionally manufactured motor vehicle design elements can be seen in that paints typically have a significant layer thickness, which cannot fall short of a minimum thickness in order to have covering properties—typical layer thicknesses may in total lie above 100 micrometer or more. The application of paints is on the one hand time-consuming and the surface structure of the plastic component is on the other hand covered and not completely reproduced due to the required layer thickness of the paint. The color impressions and color effects, which can be achieved by means of paints, are also limited due to the composition of the paints and the type of their application, wherein only non-luminous colors typically can be applied on the substrates for cost reasons. Non-luminous colors are colors, in which the color impression is created due to the absorption of individual color components of the incident light. Until now, the properties of paints were optimized by varying the painting processes, as well as the composition of the paints to be applied.

With respect to the manufacture of an opaque motor vehicle design element, an objective therefore can be seen in developing a method for manufacturing an opaque motor vehicle design element that has an improved optical appearance.

This objective is attained with a method of the initially mentioned type, in which the following inventive steps are carried out:

A using a dimensionally stable substrate, which is a heat-resistant for a temperature of at least 60° C., and introducing the substrate into a vacuum chamber, B applying a chromophoric first metallic and at least partially reflective layer (e.g. with a reflectance of at least 50% in a wavelength range of visible light) on the substrate, which according to step A) is located in the vacuum chamber, by means of a PVD process, C c1) carrying out the application of the chromophoric first layer in accordance with step B) in such a way that an opaque layer with a layer thickness of at least 20 nm, particularly between 30 and 40 nm, is achieved or c2) applying a second chromophoric layer that covers the first layer, wherein the second layer is at least partially transparent and designed in such a way that light incident on the design element is at least partially manipulated due to interference, particularly destructive interference, in that the light beams reflected by the surface of the first layer are superimposed with the light beams reflected by the surface of the second layer.

The use of a PVD process represents a complete shift away from previous coating processes for vehicle headlamp design elements. As initially mentioned, optical specifications for the design elements were until now typically implemented with the design of a suitable coat of paint, which in turn was associated with the initially mentioned disadvantages and limitations. In contrast, the utilization of the PVD process allows the application of extremely thin layer thicknesses, wherein the coloration is not achieved with non-luminous colors only, but rather due to interference effects.

In other words, the present invention allows a metallic color coating of plastic substrates.

The total thickness of all layers applied on the substrate particularly may be no greater than 500 nm, preferably no greater than 300 nm and no smaller than 50 nm. In this way, the surface structure of the substrate is largely reproduced and the coating is reduced to the extent required for the coloration.

It is preferred that the pressure in the vacuum chamber amounts to less than $10^{-2}$ mBar, particularly less than $10^{-3}$ mBar. In this way, it can be ensured that the coating is applied with the required quality and largely free of contaminants.

The second layer particularly may have a transmittance of at least 70%. This makes it possible to optimize the interference effect. "Muted" colors can be produced with a rather low transmission of the layer.

A protective layer preferably is applied on the layer applied in accordance with step C) by means of plasma polymerization, wherein this protective layer particularly is a layer consisting of hexamethyldisiloxane (HMDSO). The protective layer particularly may be designed in such a way that the light reflected by the motor vehicle design element is manipulated with respect to its color composition due to interference in at least one spectral component of the light. To this end, the protective layer is at least partially transparent. In addition, the water vapor resistance of the coating, as well as its mechanical resistance, is increased by the protective layer.

It is preferred that a—preferably transparent—base layer is applied on the substrate prior to the application of the first layer in accordance with step B). This base layer may consist of the same material as that used for the protective layer, i.e. of a layer that is applied, for example, by means of plasma polymerization (PECVD), wherein this protective layer particularly may be a layer consisting of hexamethyldisiloxane (HMDSO).

The substrate particularly may consist of a plastic, preferably of polycarbonate, polyester amide, polyetherimide, ABS, technical thermoplastics or thermosetting plastics.

The substrate may alternatively consist of glass or metal.

The PVD process particularly may be carried out in the form of a sputtering process.

It is preferred that the application and design of the first layer in accordance with steps B) and C c1) takes place without a reactive gas during the sputtering process.

It is preferred that the application of the second layer in accordance with step C c2) takes place by means of sputtering, wherein titanium is made available by a sputtering target, wherein said titanium reacts with oxygen, which is introduced into the sputtering process in the form of a reactive gas, and thereby forms a titanium dioxide layer on the first layer, and wherein the layer thickness of the second layer is defined by specifying the coating rate and/or the duration of the coating process. For example, a plurality of (interference) colors (blue, gold, violet, green, yellow) can be produced by combining titanium (knocked out of the sputtering target) and oxygen (in the form of a reactive gas), wherein the actual color depends on the thickness of the coating. Exemplary "recipes" for an entire coating structure may read as follows:

Select a suitable sputtering target that allows the application of a metallic layer, wherein the metal for the metallic layer may be selected from the following list: {titanium, chromium, silicon, aluminum, special steel, copper, zirconium}. Optionally, a base layer, e.g. of HMDSO, may initially be applied on a substrate (by means of PECVD as mentioned above). Then apply the so-called first layer consisting of one of the aforementioned metals or mixtures thereof without a reactive gas. Subsequently, apply a second layer by using a reactive gas such as oxygen. A metal ceramic is produced due to the chemical reaction of the metal with the reactive gas. These metal ceramics usually have significantly different properties than pure metals, e.g. a greater hardness, a greater chemical resistance and significantly different optical properties (e.g. transparence)—which make it possible to produce color by means of interference. Due to the small layer thickness, the properties of these metal ceramics should not necessarily be considered to be identical to the properties of the same material in bulk form (titanium dioxide is no longer transparent in greater thicknesses, but rather a white powder—white pigment). The sputtering target preferably remains unchanged during this process, i.e. the same starting material as in the first layer can be used. The aforementioned protective layer may be optionally applied after the application of the second layer.

The second layer alternatively may consist of the same starting material as the first layer.

The application of the second chromophoric layer in accordance with step C c2) particularly may take place while a reactive gas is added during the sputtering process. In contrast to a non-reactive sputtering process, another gas (or gas mixture) is provided in the sputtering chamber in addition to the gas causing the ionization (e.g. argon) during a reactive sputtering process, wherein said additional gas reacts with the material knocked out of the target and thereby changes the deposited layer (for example, titanium removed from a sputtering target can react with oxygen to form titanium dioxide and thereby produce a titanium dioxide layer on the substrate or the first layer, respectively). Due to the chemical change caused by the reaction with the reactive gas, such layers can have a significantly altered property spectrum (for example, metal can suddenly assume ceramic-like or glass-like properties). Any gas that can react with the metal basically may be considered as reactive gas. However, oxygen, nitrogen or carbonaceous gases (CO or acetylene or methane) or mixtures thereof are normally used.

The temperature in steps B) and C) particularly may lie below 100° C., preferably below 70° C., especially below 60° C. This can be achieved by purposefully controlling the energy input during the sputtering process. As a result, the inventive method basically can also be applied to substrates that have a lower temperature resistance.

As an alternative to the sputtering process, the PVD process may also be carried out in the form of a thermal evaporation process (thermal evaporation). Other examples of conceivable PVD methods are electron beam evaporation, laser beam evaporation and arc evaporation (arcing).

The first layer particularly may comprise aluminum. This first layer may be applied, for example, by means of a non-reactive sputtering process. Aluminum has a particularly high reflectance and therefore is particularly suitable for use as the first layer.

The following non-reactive sputtering process is mentioned as a suitable example for applying the first layer: argon gas is introduced into the vacuum chamber (up to a desired pressure range, e.g., of $1\times10^{-4}$ mBar) and the target (cathode) is energized—while the anode is usually represented by the chamber wall or the devices—such that the argon ionizes (into Ar+) due to the voltage and is accelerated toward the (negatively charged) cathode, wherein the impulse caused by the (mechanical) impact of the argon ions is transmitted to the atoms of the target and—once sufficient energy is available—a portion of the target atoms separates and flies into space, and wherein the flight distance of the sputtered atoms is at a sufficiently low pressure in the chamber so high that they can reach the substrate and condense thereon. The base material for the applied layers forms the target during the sputtering process (usually metals, but ceramics may also be used).

It is preferred that the metallic and at least partially reflective first layer (layer 1) has a layer thickness that lies between a minimum layer thickness and a maximum layer thickness, wherein the minimum layer thickness is the thickness required for ensuring a transmittance of less than 10%, particularly less than 5%, preferably less than 1%, and the maximum layer thickness is no greater than the quadruple minimum layer thickness, preferably no greater than triple or double the minimum layer thickness. In this way, a sufficient thickness and layer thickness on the substrate can be ensured along the entire layer and a significantly greater layer thickness than necessary for the technical purpose can at the same time be avoided. The surface contours of the substrate therefore remain well preserved. The minimum layer thicknesses depend on the material used for the layer. For example, a minimum layer thickness may amount to approximately 35 nm (nanometer) for aluminum, to approximately 60 nm for titanium, to approximately 80 nm for copper and to approximately 70 nm for zirconium. Upper limits for the layer thickness of the first layer may also be defined and could lie below 500 nm, particularly below 200 nm.

The second layer particularly may be largely free of non-luminous colors, wherein a non-luminous color is a color that becomes discernible due to at least partial absorption of spectrums of the visible light, wherein the extent of the absorption of the color components red, green and blue is dissimilar, and wherein the second layer is designed in such a way that the light reflected by the motor vehicle design element is manipulated with respect to its color composition due to destructive interference in at least one spectral component of the light. Typical layer thicknesses for the second layer may lie, for example, between 10 nm and 2000 nm depending on the material used. When a layer of titanium oxide (refractive index of approximately 2.8) is used, for example, the wavelength of visible light is reduced in comparison with the value in the vacuum by the factor 2.8 and the thickness is then chosen such that integral multiple divisors of at least individual spectral components can form. For example, layer thicknesses between 10 nm and 500 nm may be chosen for titanium oxide.

It is preferred that the side of the substrate to be coated has a surface design that is smooth in at least one section and rough or structured in at least one other section. A rough surface may be designed, for example, in the form of a surface that acts in a metallically brushed manner, wherein the inventive coating structure is in contrast to a conventional coating by means of paints sufficiently thin for still reproducing the roughness of the surface in practically unchanged form. However, paint coatings become "indistinct" on the surface to be coated and cover such rough or structured surfaces due to the greater layer thickness required for paints.

All device characteristics disclosed in the above-described inventive method, as well as the resulting advantages, may also form part of the devices described below. The invention furthermore relates to a motor vehicle design element that is manufactured in accordance with an inventive method, wherein the motor vehicle design element comprises a dimensionally stable substrate, on which a first chromophoric and metallically reflective layer is applied, wherein this layer either is designed in such a way that an opaque layer with a layer thickness of at least 20 nm is achieved or a second chromophoric layer covering the first layer is provided, and wherein the second layer is at least partially transparent and designed in such a way that light incident on the design element is at least partially manipulated due to interference in that the light beams reflected by the surface of the first layer are superimposed with the light beams reflected by the surface of the second layer.

The invention furthermore may relate to a vehicle headlamp comprising an inventive opaque motor vehicle design element. The use of such a design element within the vehicle headlamp has the advantage that the design element is thereby largely protected from environmental influences in an efficient manner.

In addition, the invention may relate to a motor vehicle comprising an inventive opaque motor vehicle design element, particularly in the form of a screen element, and/or an inventive vehicle headlamp.

The first or second layer of the motor vehicle design element preferably is arranged in such a way that it is visible to a person located inside or outside the motor vehicle in an operating state of the motor vehicle.

In other words, the invention may comprise the following characteristics:
- a multi-chamber PVD coating system with a very good high-vacuum generating unit
- sputtering different coating materials in connection with reactive gases for producing colored layers
- most precise control of the process management by means of plasma emission spectral analysis and real-time control of the reactive gas flow (mass flow controller)
- producing a metallic mirror layer followed by a chromophoric reactive layer for producing the color
- upstream and downstream plasma treatment processes
- flexible color selection possible by changing the process parameters—set-up only required partially (depending on the desired color)!

The invention is described in greater detail below with reference to the exemplary and non-restrictive embodiments illustrated in the figures.

In the following figures, identical characteristics are—unless otherwise indicated—identified by the same reference symbols.

Figure 1:
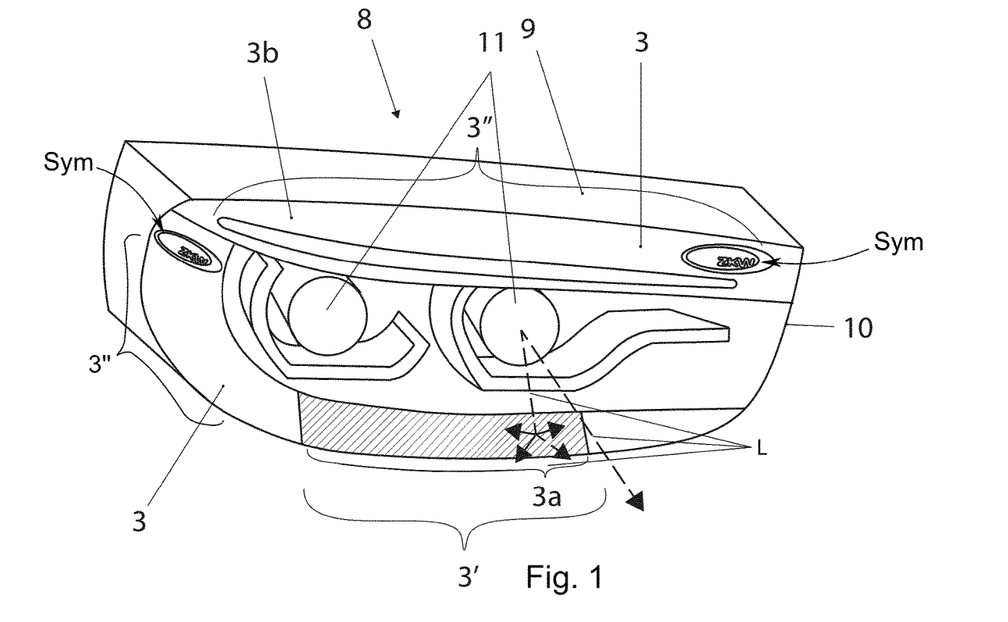
FIG. 1 shows a schematic representation of a first embodiment of an inventive motor vehicle headlamp.

FIG. 1 shows a schematic representation of a first embodiment of an inventive motor vehicle headlamp 8. The motor vehicle headlamp 8 comprises a vehicle headlamp housing 9, an at least sectionally transparent cover pane 10 that closes the vehicle headlamp housing 9, a light source 11 that is accommodated in the vehicle headlamp housing 9 and serves for radiating light through the cover pane 10, as well as at least one motor vehicle design element 3 that is accommodated in the vehicle headlamp housing 9.

Two light sources 11 and two design elements 3 are provided in the present embodiment. Each motor vehicle design element 3 comprises a dimensionally stable substrate 1 (see FIGS. 3 to 8) with at least one coated side, wherein the coated side of the substrate 1 has at least two sections that differ with respect to their surface design, namely a first section 3a that has a rough surface and a second section 3b that has a smooth surface. The coating of the coated side of the substrate 1 is formed by at least a first chromophoric and metallically reflective layer L1 (see, for example, FIG. 6). In addition, a second chromophoric layer L2 (see FIG. 7 and FIG. 8) is provided and covers the first layer L1, wherein the second layer L2 is at least partially transparent and designed in such a way that light incident on the at least one motor vehicle design element 3 is at least partially manipulated due to interference in that the light beams LS1 reflected by the surface of the first layer L1 are superimposed with the light beams LS2 reflected by the surface of the second layer L2. The respective layers L1, L2 are applied in such a way that the surface designs of the respective sections 3a, 3b of the substrate 1 are transferred to the layers L1, L2 such that light incident on the respective layer in the region of the first section 3a, 3b is scattered in accordance with the surface design of the first section 3a of the substrate 1 and light incident on the respective layer in the region of the second section 3b is reflected in accordance with the surface design of the second section 3b of the substrate 1.

The expression "the surface design is transferred" refers to the layers being designed correspondingly thin and homogenous such that the projections and depressions, which the surface to be coated has in the uncoated state, are largely transferred to the surface of the coating at the ratio 1:1. In this context, the term "largely" means that the coating changes the amplitudes of the projections/depressions by less than 5%.

The first layer L1 and/or the second layer L2 advantageously may have a constant composition and layer thickness along the entire side of the substrate 1 to be coated. The first layer L1 may be designed in such a way that an opaque layer with a layer thickness of at least 20 nm is formed by the first layer L1. The first section 3a is enclosed by the second section 3b and designed in such a way that a graphic symbol SYM is depicted due to the rough surface design of the first section 3a, wherein said graphic symbol is visible in the form of an optical contrast to the surrounding reflective area of the second section 3b. The graphic symbol may be an arbitrary symbol.

A radiation area 3' is outlined in the lower of the two motor vehicle design elements 3 and at least partially arranged in the beam path of the light source 11 as indicated with exemplary light beams L. The first section 3a completely extends over the radiation area 3' and therefore completely covers this radiation area. In this way, light that originates from the light source 11 and is incident in the radiation area 3' is scattered in multiple directions in the radiation area 3'. The radiation area 3' particularly may be completely arranged in the beam path of the light source 11 and therefore cover the entire area of the motor vehicle design element 3 that can be directly irradiated by the light source 11 or the light sources 11, respectively. In this way, the risk of dazzle caused by the scattering properties of the section 3a can be completely precluded.

FIG. 1 also shows that the coated side of the substrate 1 of both motor vehicle design elements 3 respectively has an ambient light reflection area 3" that is located outside the beam path of the light source 11, wherein the second section 3b extends at least partially, particularly completely, over the ambient light reflection area 3b. It would be possible, in particular, that the ambient light reflection area 3" covers the entire visible area of the at least one motor vehicle design element 3, which lies outside of the beam path of the light source 11, in the installed state.

The rough surface of the second section 3b advantageously may have an average roughness value Ra of at least 2.0 µm. In addition, the smooth surface of the second section 3b may have an average roughness value Ra of no more than 0.25 µm.

Figure 2:
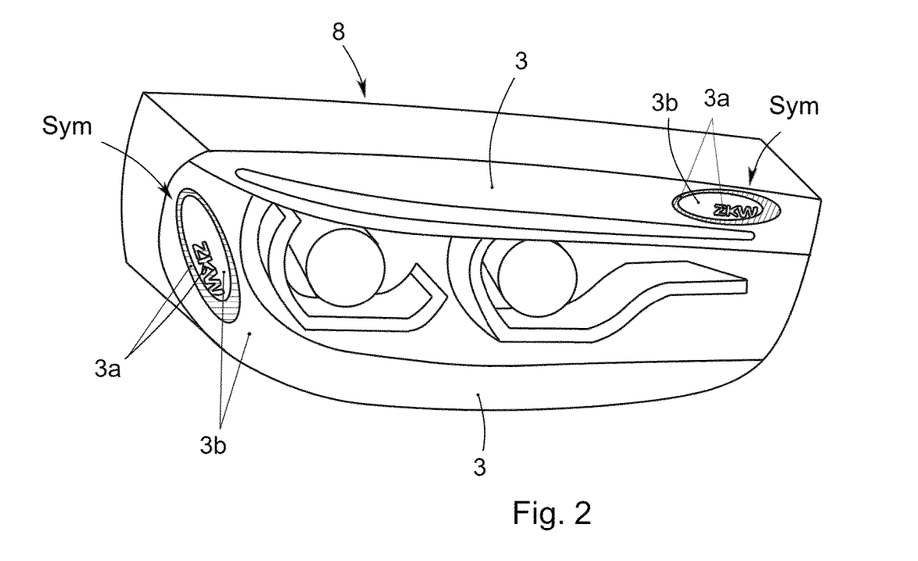
FIG. 2 shows a schematic representation of a second embodiment of an inventive motor vehicle headlamp.

FIG. 2 shows a schematic representation of a second embodiment of an inventive motor vehicle headlamp 8, in which the symbols Sym are designed slightly larger. The smooth section 3b of the respective symbols Sym is enclosed by an outer rough section 3a. Another rough section 3a is enclosed within the respective smooth section 3b. As an example, a logo of the patent applicant, namely the ZKW Group, is respectively illustrated in the figures.

Figure 7:
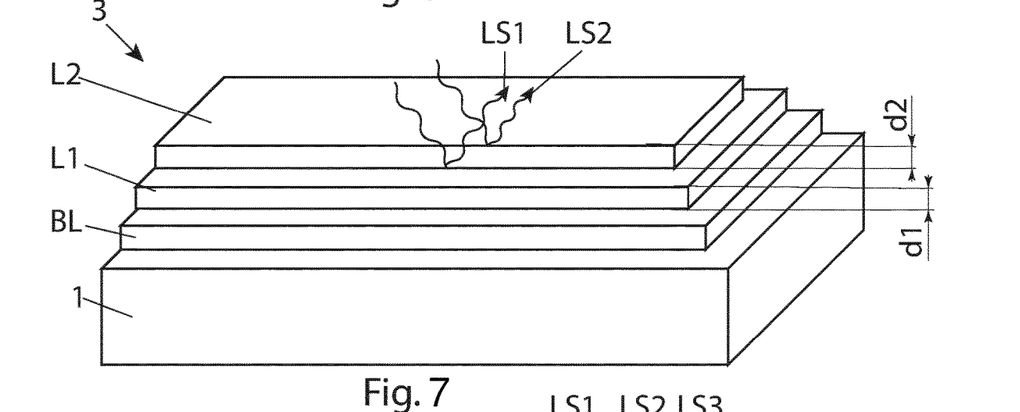
FIG. 7 shows a schematic representation of the substrate comprising a base layer, a first layer and a second layer according to the invention.
Figure 8:
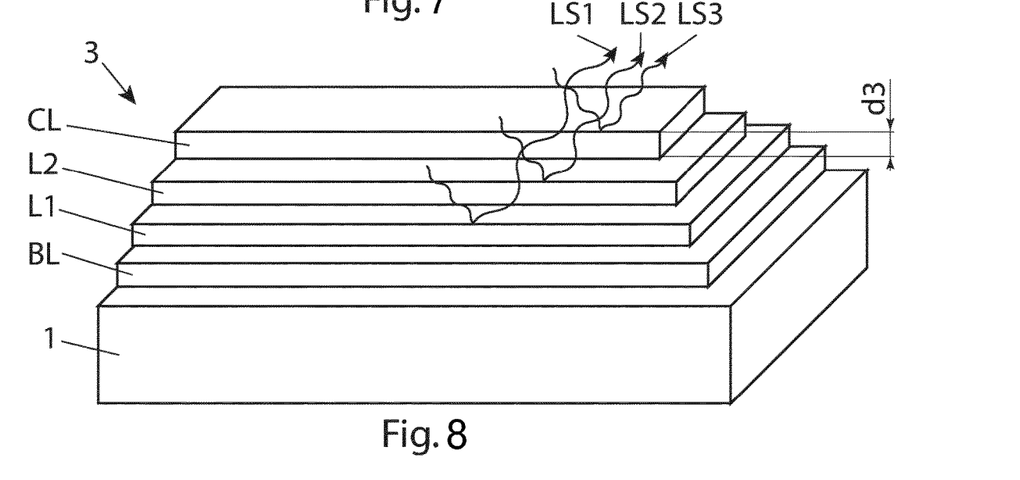
FIG. 8 shows a schematic representation of the substrate comprising a base layer, a first layer, a second layer and a protective layer according to the invention.

With respect to FIGS. 7 and 8, it should be noted that the second layer L2 may have a transmittance of at least 70%. A protective layer CL may be applied on the second layer L2 by means of plasma polymerization, wherein this protective layer CL particularly may be a layer consisting of hexamethyldisiloxane. The protective layer CL preferably is designed in such a way that the light reflected by the motor vehicle design element is manipulated with respect to its color composition due to interference in at least one spectral component of the light. A base layer BL may also be arranged between the substrate 1 and the first layer L1.

The metallic and at least partially reflective first layer L1 preferably has a layer thickness d1 that lies between a minimum layer thickness and a maximum layer thickness, wherein the minimum layer thickness is the thickness required for ensuring a transmittance of less than 1% and the maximum layer thickness is no greater than the quadruple minimum layer thickness, preferably no greater than triple or double the minimum layer thickness.

The second layer L2 may be largely free of non-luminous colors, wherein a non-luminous color is a color that becomes discernible due to at least partial absorption of spectrums of the visible light, wherein the extent of the absorption of the color components red, green and blue is dissimilar, and wherein the second layer is designed in such a way that the light reflected by the motor vehicle design element 3 is manipulated with respect to its color composition due to interference in at least one spectral component of the light.

Figure 3:
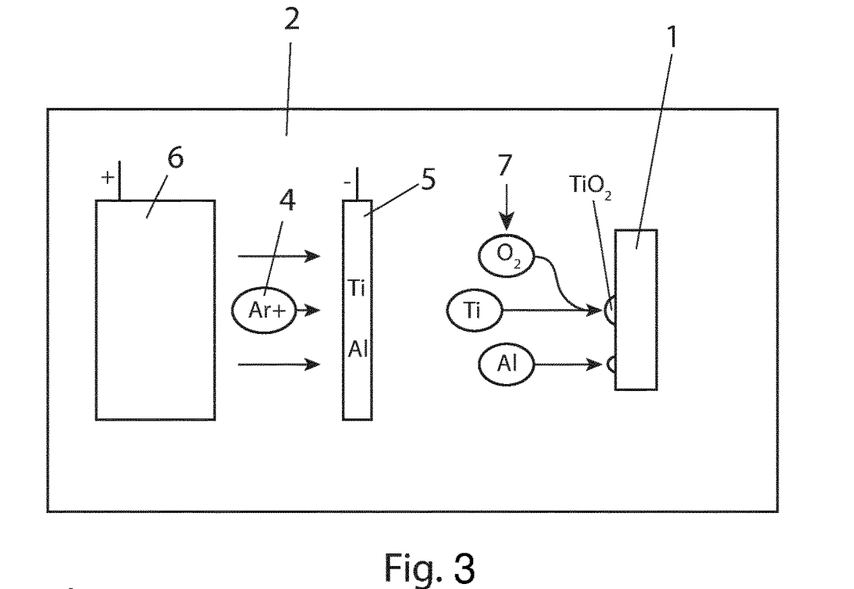
FIG. 3 shows a schematic representation of a sputtering process, by means of which the layers can be produced on a substrate in accordance with the inventive method.

FIG. 3 shows a schematic representation of a sputtering process, by means of which the layers can be produced on a substrate 1 in accordance with the inventive method. This method is suitable for manufacturing an opaque motor vehicle design element 3 (see FIGS. 6, 7 and 8) and comprises the following steps:

A using a dimensionally stable substrate 1, which is a heat-resistant for a temperature of at least 60° C., and introducing the substrate 1 into a vacuum chamber, B applying a chromophoric first metallic and at least partially reflective layer L1 (see FIGS. 6, 7 and 8) on the substrate 1, which according to step a) is located in the vacuum chamber 2, by means of a PVD process, namely by means of a sputtering process in the present example, C c1) carrying out the application of the chromophoric first layer L1 in accordance with step B) in such a way that an opaque layer with a layer thickness of at least 20 nm is achieved or c2) applying a second chromophoric layer L2 (FIGS. 7 and 8) that covers the first layer L1, wherein the second layer L2 is at least partially transparent and designed in such a way that light incident on the design element 3 is at least partially manipulated due to interference, particularly destructive interference, in that the light beams LS1 reflected by the surface of the first layer L1 are superimposed with the light beams LS2 reflected by the surface of the second layer L2.

The example according to FIG. 3 shows different variations, by means of which layers can be applied on the substrate 1. Argon gas 4 generally is introduced into the vacuum chamber 2 (up to the desired pressure range, e.g., of $1 \times 10^{-4}$ mBar), wherein a target 5 is energized, e.g. with respect to the chamber wall 6. As a result, the argon ionizes (into Ar+) and is accelerated toward the (negatively charged) cathode 5. The impulse caused by the (mechanical) impact of the argon ions is transmitted to the atoms of the target and—once sufficient energy is available—a portion of the target atoms separates and flies into space, wherein the flight distance of the sputtered atoms is at a sufficiently low pressure in the chamber 2 so high that they can reach the substrate 1 and condense thereon. The base material for the applied layers forms the target 5 during the sputtering process (usually metals, but ceramics may also be used). Two different options for a target 5 are outlined in FIG. 3—the target accordingly, could consist, for example, of aluminum or also of titanium. Aluminum is particularly suitable for producing the aforementioned first layer L1. No reactive gas is present during the production of the first layer L1. In this case, the aluminum condenses on the target in pure form. However, FIG. 3 also shows an alternative scenario, in which an exemplary titanium target is used, wherein the titanium material or the titanium atoms knocked out of the target react with a reactive gas 7—presently oxygen—in order to form titanium dioxide and condense on the substrate 1. The initially mentioned second layer L2 can be produced in this way. The first layer L1 typically is applied first in a non-reactive sputtering process and the second layer L2 is subsequently applied on top of the first layer L1 after the introduction of a reactive gas 7.

Figure 4:
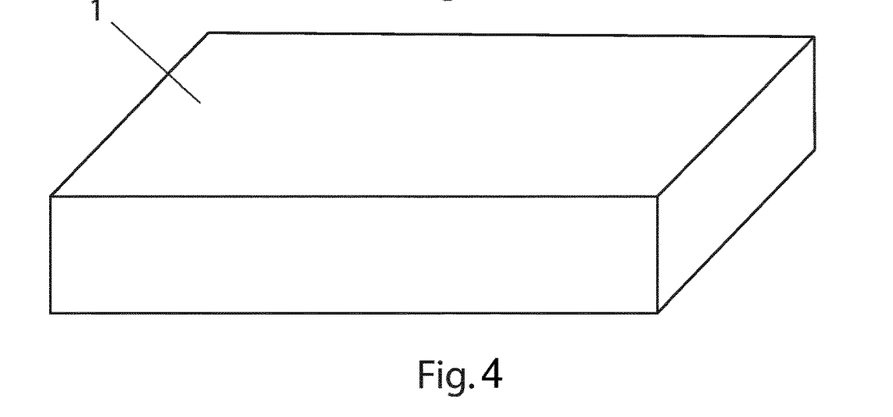
FIG. 4 shows a schematic representation of a substrate.

FIG. 4 shows a schematic representation of a substrate 1, e.g. a substrate consisting of plastic, particularly polycarbonate, polyester amide, polyetherimide, ABS, technical thermoplastics or thermosetting plastics. The substrate 1 could alternatively also consist of glass or metal.

Figure 5:
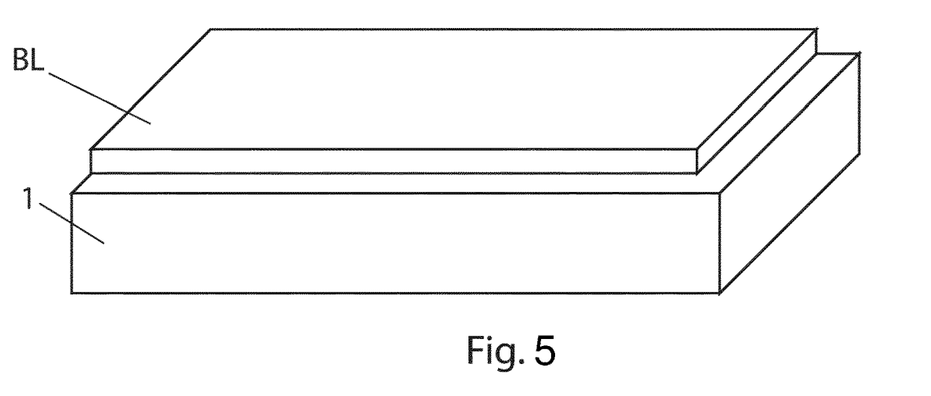
FIG. 5 shows a schematic representation of the substrate comprising a base layer.

FIG. 5 shows a schematic representation of the substrate 1 comprising a base layer BL (base layer), which can be optionally provided in order to optimally prepare the substrate 1 for the subsequent coating processes.

Figure 6:
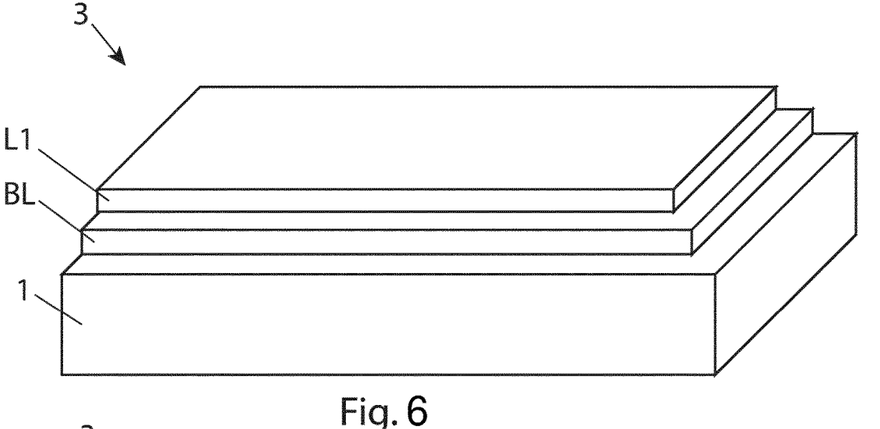
FIG. 6 shows a schematic representation of the substrate comprising a base layer and a first layer according to the invention.

FIG. 6 shows a schematic representation of the substrate 1 comprising the base layer BL and the aforementioned first layer L1 according to the invention. FIG. 7 shows a schematic representation of the substrate 1 comprising a base layer BL, the first layer L1 and the second layer L2 according to the invention. FIG. 7 furthermore shows the aforementioned light beams LS1 and LS2 that are superimposed with one another, wherein the color of the light reflected by the design element 3 can be influenced by the superposition. The color effect is dependent on the selection of the layer materials, as well as on the layer thicknesses d1 and d2.

FIG. 8 shows a schematic representation of the substrate 1 comprising the base layer BL, the first layer L1, the second layer L2 and a protective layer CL (coat layer) according to the invention. The protective layer CL is applied by means of plasma polymerization, wherein this protective layer CL particularly may be a layer consisting of hexamethyldisiloxane. This protective layer CL is transparent, but nevertheless significantly involved in the coloration depending on the layer thickness d3 because light LS3 is likewise reflected by this layer on the boundary surface with the surrounding medium (e.g. air) and superimposed with the reflected light beams LS1 and LS2. In addition, the application of the protective layer CL changes the reflection behavior of the second layer L2 and therefore of the light beams LS2 insofar as the protective layer CL has a dielectric constant that differs from air. The protective layer CL therefore can be designed in such a way that the light reflected by the motor vehicle design element 3 is manipulated with respect to its color composition due to destructive interference in at least one spectral component of the light.

It is preferred that the total thickness of all layers applied on the substrate 1 is no greater than 500 nm, preferably no greater than 300 nm and no smaller than 50 nm.

FIGS. 6 to 8 show a motor vehicle design element 3 that is manufactured in accordance with the described method, wherein the motor vehicle design element 3 comprises the dimensionally stable substrate 1, on which a first chromophoric and metallically reflective layer L1 is applied, wherein this layer L1 either is designed in such a way that an opaque layer with a layer thickness of at least 20 nm is achieved or a second chromophoric layer L2 covering the first layer L1 is provided, and wherein the second layer L2 is at least partially transparent and designed in such a way that light incident on the design element 3 is at least partially manipulated due to interference in that the light beams LS1 reflected by the surface of the first layer L1 are superimposed with the light beams LS2 reflected by the surface of the second layer L2.

In light of this scientific disclosure, a person skilled in the art can arrive at other, not-shown embodiments of the invention without inventive activity. Consequently, the invention is not limited to the embodiments shown, but rather defined by the entire scope of protection of the claims. Individual aspects of the invention or the embodiments can also be selected and combined with one another. Any reference symbols in the claims are exemplary and merely serve for easier readability of the claims, but do not restrict these claims.

The invention claimed is:
1. A motor vehicle headlamp (8) comprising
a vehicle headlamp housing (9);

an at least sectionally transparent cover pane (10) that closes the vehicle headlamp housing (9);
a light source (11) that is accommodated in the vehicle headlamp housing (9) and serves for radiating light through the cover pane (10); and
at least one motor vehicle design element (3) that is accommodated in the vehicle headlamp housing (9), wherein the at least one motor vehicle design element (3) comprises a dimensionally stable substrate (1) with at least one coated side,
wherein the coated side of the substrate (1) has at least two sections that differ with respect to their surface design, namely a first section (3a) that has a rough surface and a second section (3b) that has a smooth surface,
wherein the coating of the coated side of the substrate (1) is formed by at least a first chromophoric and metallically reflective layer (L1) and a second chromophoric layer (L2) covering the first layer (L1), wherein the second layer (L2) is at least partially transparent and designed in such a way that the light incident on the at least one motor vehicle design element (3) is at least partially manipulated due to interference in that the light beams (LS1) reflected by the surface of the first layer (L1) are superimposed with the light beams (LS2) reflected by the surface of the second layer (L2), and
wherein the respective layers (L1, L2) are applied in such a way that the surface designs of the respective sections (3a, 3b) of the substrate (1) are transferred to the layers (L1, L2) such that light incident on the respective layer in the region of the first section (3a, 3b) is scattered in accordance with the surface design of the first section (3a) of the substrate (1) and light incident on the respective layer in the region of the second section (3b) is reflected in accordance with the surface design of the second section (3b) of the substrate (1).

2. The motor vehicle headlamp (8) according to claim 1, wherein the first layer (L1) and/or the second layer (L2) has a constant composition and layer thickness along the entire side of the substrate (1) to be coated.

3. The motor vehicle headlamp (8) according to claim 1, wherein the first layer (L1) is designed in such a way that an opaque layer with a layer thickness of at least 20 nm is formed by the first layer (L1).

4. The motor vehicle headlamp (8) according to claim 1, wherein the first section (3a) is enclosed by the second section (3b) and designed in such a way that a graphic symbol (SYM) is depicted due to the rough surface design of the first section (3a), and wherein said graphic symbol is visible in the form of an optical contrast to the surrounding reflective area of the second section (3b).

5. The motor vehicle headlamp (8) according to claim 1, wherein the at least one motor vehicle design element (3) has a radiation area (3') that is at least partially arranged in the beam path of the light source (11), and wherein the first section (3a) completely extends over the radiation area (3') and therefore completely covers this radiation area such that light, which originates from the light source (11) and is incident into the radiation area (3'), is scattered in the radiation area (3').

6. The motor vehicle headlamp (8) according to claim 5, wherein the radiation area (3') is completely arranged in the beam path of the light source (11).

7. The motor vehicle headlamp (8) according to claim 1, wherein the coated side of the substrate (1) of the at least one motor vehicle design element (3) has an ambient light reflection area (3") that is located outside the beam path of the light source (11), wherein the second section (3b) extends at least partially over the ambient light reflection area (3b).

8. The motor vehicle headlamp (8) according to claim 7, wherein the ambient light reflection area (3") covers the entire visible area of the at least one motor vehicle design element (3), which lies outside of the beam path of the light source (11), in the installed state.

9. The motor vehicle headlamp (8) according to claim 7, wherein the second section (3b) extends completely over the ambient light reflection area (3b).

10. The motor vehicle headlamp (8) according to claim 1, wherein the rough surface of the second section (3b) has an average roughness value Ra of at least 2.0 μm.

11. The motor vehicle headlamp (8) according to claim 1, wherein the smooth surface of the second section (3b) has an average roughness value Ra of no more than 0.25 μm.

12. The motor vehicle headlamp (8) according to claim 1, wherein the second layer (L2) has a transmittance of at least 70%.

13. The motor vehicle headlamp (8) according to claim 1, wherein a protective layer (CL) is applied on the second layer (L2) by means of plasma polymerization.

14. The motor vehicle headlamp (8) according to claim 13, wherein the protective layer (CL) consists of hexamethyldisiloxane.

15. The motor vehicle headlamp (8) according to claim 1, wherein a base layer (BL) is arranged between the substrate (1) and the first layer (L1).

16. The motor vehicle headlamp (8) according to claim 1, wherein the metallic and at least partially reflective first layer (L1) has a layer thickness (d1) that lies between a minimum layer thickness and a maximum layer thickness, wherein the minimum layer thickness is the thickness required for ensuring a transmittance of less than 1% and the maximum layer thickness is no greater than the quadruple minimum layer thickness.

17. The motor vehicle headlamp (8) according to claim 16, wherein the maximum layer thickness is no greater than triple the minimum layer thickness.

18. The motor vehicle headlamp (8) according to claim 16, wherein the maximum layer thickness is no greater than double the minimum layer thickness.

19. The motor vehicle headlamp (8) according to claim 1, wherein the second layer (L2) is largely free of non-luminous colors, wherein a non-luminous color is a color that becomes discernible due to at least partial absorption of spectrums of the visible light, wherein the extent of the absorption of the color components red, green and blue is dissimilar, and wherein the second layer is designed in such a way that the light reflected by the motor vehicle design element (3) is manipulated with respect to its color composition due to interference in at least one spectral component of the light.

\* \* \* \* \*